(12) United States Patent
Iwagaki et al.

(10) Patent No.: US 9,755,166 B2
(45) Date of Patent: Sep. 5, 2017

(54) LUMINESCENT DEVICE AND METHOD OF MANUFACTURING THE SAME INCLUDING FORMING A PLURALITY OF NOTCHES OR SLITS IN A SUBSTRATE TO ENABLE PLANAR LIGHT EMITTANCE IN A CURVED STATE

(71) Applicant: Konica Minolta Inc., Tokyo (JP)

(72) Inventors: Masaru Iwagaki, Hachioji (JP); Tsukasa Yagi, Kobe (JP); Masahiro Morikawa, Hachioji (JP); Nobuya Miki, Ibaraki (JP)

(73) Assignee: KONICA MINOLTA, INC., Tokyo (JP)

( * ) Notice: Subject to any disclaimer, the term of this patent is extended or adjusted under 35 U.S.C. 154(b) by 32 days.

(21) Appl. No.: 14/434,250

(22) PCT Filed: Oct. 16, 2013

(86) PCT No.: PCT/JP2013/078045
§ 371 (c)(1),
(2) Date: Apr. 8, 2015

(87) PCT Pub. No.: WO2014/065169
PCT Pub. Date: May 1, 2014

(65) Prior Publication Data
US 2015/0280152 A1    Oct. 1, 2015

(30) Foreign Application Priority Data

Oct. 24, 2012 (JP) ................................ 2012-234329
Oct. 24, 2012 (JP) ................................ 2012-234330

(51) Int. Cl.
*H01L 51/00* (2006.01)
*H01L 51/52* (2006.01)
(Continued)

(52) U.S. Cl.
CPC ............ *H01L 51/0096* (2013.01); *B60Q 1/26* (2013.01); *B60Q 3/74* (2017.02); *F21S 48/1163* (2013.01);
(Continued)

(58) Field of Classification Search
None
See application file for complete search history.

(56) References Cited

U.S. PATENT DOCUMENTS

2006/0043598 A1*  3/2006  Kirby .................... B82Y 10/00
                                                              257/774
2006/0087224 A1*  4/2006  Oki ..................... H01L 27/3276
                                                              313/504

FOREIGN PATENT DOCUMENTS

JP          02234390 A      9/1990
JP          11162633 B2     6/1999
(Continued)

OTHER PUBLICATIONS

International Search Report dated Jan. 14, 2014 for PCT/JP2013/078045.

*Primary Examiner* — Jay C Chang
(74) *Attorney, Agent, or Firm* — Lucas & Mercanti, LLP

(57) ABSTRACT

A luminescent device that has at least an anode layer (32), a cathode layer (36), and an organic EL layer (34) formed on a transparent substrate (30), and has the organic EL layer (34) placed between the anode layer (32) and the cathode layer (36) is disclosed.
In this luminescent device, notches (22) are formed at the rim portion of the transparent substrate, and patterning is performed on the transparent substrate (30) so that the organic EL layer (34) avoids the notches (22), and the anode layer (32) and the cathode layer (34) overlap the organic EL layer (34). Part of the anode layer (32) and part of the
(Continued)

cathode layer (36) are exposed through the respective notches (22) of the transparent substrate (30).

13 Claims, 9 Drawing Sheets

(51) Int. Cl.
*H01L 51/56* (2006.01)
*F21S 8/10* (2006.01)
*B60Q 1/26* (2006.01)
*B60Q 3/74* (2017.01)
*B60Q 1/32* (2006.01)

(52) U.S. Cl.
CPC ........ *F21S 48/217* (2013.01); *H01L 51/0097* (2013.01); *H01L 51/52* (2013.01); *H01L 51/5209* (2013.01); *H01L 51/5225* (2013.01); *H01L 51/5228* (2013.01); *H01L 51/56* (2013.01); *B60Q 1/32* (2013.01); *B60Q 3/745* (2017.02); *B60Q 2400/10* (2013.01); *H01L 51/5253* (2013.01); *H01L 2251/5361* (2013.01); *Y02E 10/549* (2013.01); *Y02P 70/521* (2015.11)

(56) References Cited

FOREIGN PATENT DOCUMENTS

| JP | 2009-016186 | B2 | 1/2009 |
| JP | 2009-140987 | A | 6/2009 |
| JP | 2009-170173 | A | 7/2009 |
| JP | 4734473 | B2 | 4/2011 |

* cited by examiner

LIGHT

LUMINESCENT DEVICE AND METHOD OF MANUFACTURING THE SAME INCLUDING FORMING A PLURALITY OF NOTCHES OR SLITS IN A SUBSTRATE TO ENABLE PLANAR LIGHT EMITTANCE IN A CURVED STATE

CROSS REFERENCE TO RELATED APPLICATION

This Application is a 371 of PCT/JP2013/078045 filed on Oct. 16, 2013 which, in turn, claimed the priority of Japanese Patent Application No. JP2012-234330 filed on Oct. 24, 2012 and Japanese Patent Application No. JP2012-234329 filed on Oct. 24, 2012, all applications are incorporated herein by reference.

TECHNICAL FIELD

The present invention relates to luminescent devices and methods of manufacturing the luminescent devices, and more particularly, to a luminescent device that is capable of planarly emitting light even in a three-dimensionally curved state, and a method of manufacturing the luminescent device.

BACKGROUND ART

In general, an EL (electroluminescence) panel of a self-luminescent type is light and thin, and hardly generates heat, utilizing EL phenomena. Particularly, one with an organic EL light emitting layer has advantages such as being operable with a low drive voltage and consuming less power.

Such an EL panel is formed by sequentially stacking an anode layer formed with a transparent electrode such as ITO, an organic EL layer, and a cathode layer formed with a metal electrode such as Al on a transparent substrate, and is designed to cause the organic EL layer to emit light and release light to the outside by applying voltage between the anode layer and the cathode layer.

In recent years, the use of the above EL panel as an illuminating device (a luminescent device) such as a ceiling lamp having properties such as being light and thin has been considered, and the EL panel is required to be capable of emitting light while maintaining a three-dimensional form while being used.

Patent Literatures 1 through 3 disclose examples of such luminescent devices.

Each of the techniques according to Patent Literature 1 (see paragraph [0017] and FIG. 4) and Patent Literature 2 (see paragraphs [0029] and [0030], and FIG. 2) realizes a three-dimensional spatial shape obtained in conformity with the shape of the mold by placing a stack structure including a light emitting layer between molding dies and then subjecting the stack structure to press molding.

On the other hand, the technique according to Patent Literature 3 (see paragraphs [0026] and [0027], and FIGS. 2 and 4) employs a structure in which the curved portion of a stack structure including a light emitting layer is a flexible portion formed with a conductive layer and an insulating layer for electrically connecting/insulating electrodes to/from each other, and the light emitting layer is not curved, while press molding is performed with molding dies.

CITATION LIST

Patent Literatures

Patent Literature 1: JP 3325216 B1
Patent Literature 2: JP 4734473 B1
Patent Literature 3: JP 4900094 B1

SUMMARY OF INVENTION

Technical Problem

In a case where the light emitting layer is formed with an organic EL layer, however, the organic EL layer is easily damaged by excess deformation or heat at the time of the press molding by a technique using molding dies in press molding as disclosed in Patent literatures 1 and 2. If the light emitting layer is not formed at the curved portion as disclosed in Patent Literature 3, the above problem can be solved. However, if the above described flexible portion exists separately from the light emitting portion in the stack structure including the light emitting layer, the step of manufacturing the portion is required in addition to the other steps.

It is of course possible to consider a method by which small EL panels are three-dimensionally arranged (tiling), and a method by which the light emitting layer is formed directly on a three-dimensional supporting member. By the former method, however, the manufacturing process becomes complicated, as the step of positioning the panels is required. By the latter method, it is difficult for the light emitting layer to have a uniform thickness.

Therefore, the present invention primarily aims to provide a luminescent device that has a simple structure and is capable of planarly emitting light even in a three-dimensionally curved state, and a method of manufacturing the luminescent device.

Solution to Problem

In order to solve the above problem, according to a first aspect of the present invention, there is provided a luminescent device including an EL sheet having at least an anode layer, a cathode layer, and an organic EL layer formed on a substrate, the organic EL layer being placed between the anode layer and the cathode layer, wherein a plurality of notches or slits are formed at a rim portion of the substrate, patterning is performed on the substrate so that the organic EL layer avoids the notches or the slits, and part of the anode layer and part of the cathode layer are exposed through the respective notches or the respective slits of the substrate.

According to a second aspect of the present invention, there is provided a method of manufacturing a luminescent device that includes: an EL sheet having at least an anode layer, a cathode layer, and an organic EL layer formed on a substrate, the organic EL layer being placed between the anode layer and the cathode layer; and a supporting member configured to support the EL sheet, the supporting member having a three-dimensionally curved shape, electrode portions being formed in the supporting member, the method including: the step of forming a plurality of slits at a rim portion of the substrate; the step of performing patterning on the substrate so that the anode layer, the cathode layer, and the organic EL layer avoid the slits, and exposing part of the anode layer and part of the cathode layer through the respective slits of the substrate; and the step of bonding the EL sheet and the supporting member to each other, respective exposed portions of the anode layer and the cathode layer of the EL sheet being placed to face the electrode portions of the supporting member.

Advantageous Effects of Invention

According to the present invention, it is possible to enable a simple structure to planarly emit light even in a three-dimensionally curved state.

DESCRIPTION OF EMBODIMENTS

The following is a description of preferred embodiments of the present invention, with reference to the drawings.

[First Embodiment]

Figure 1:
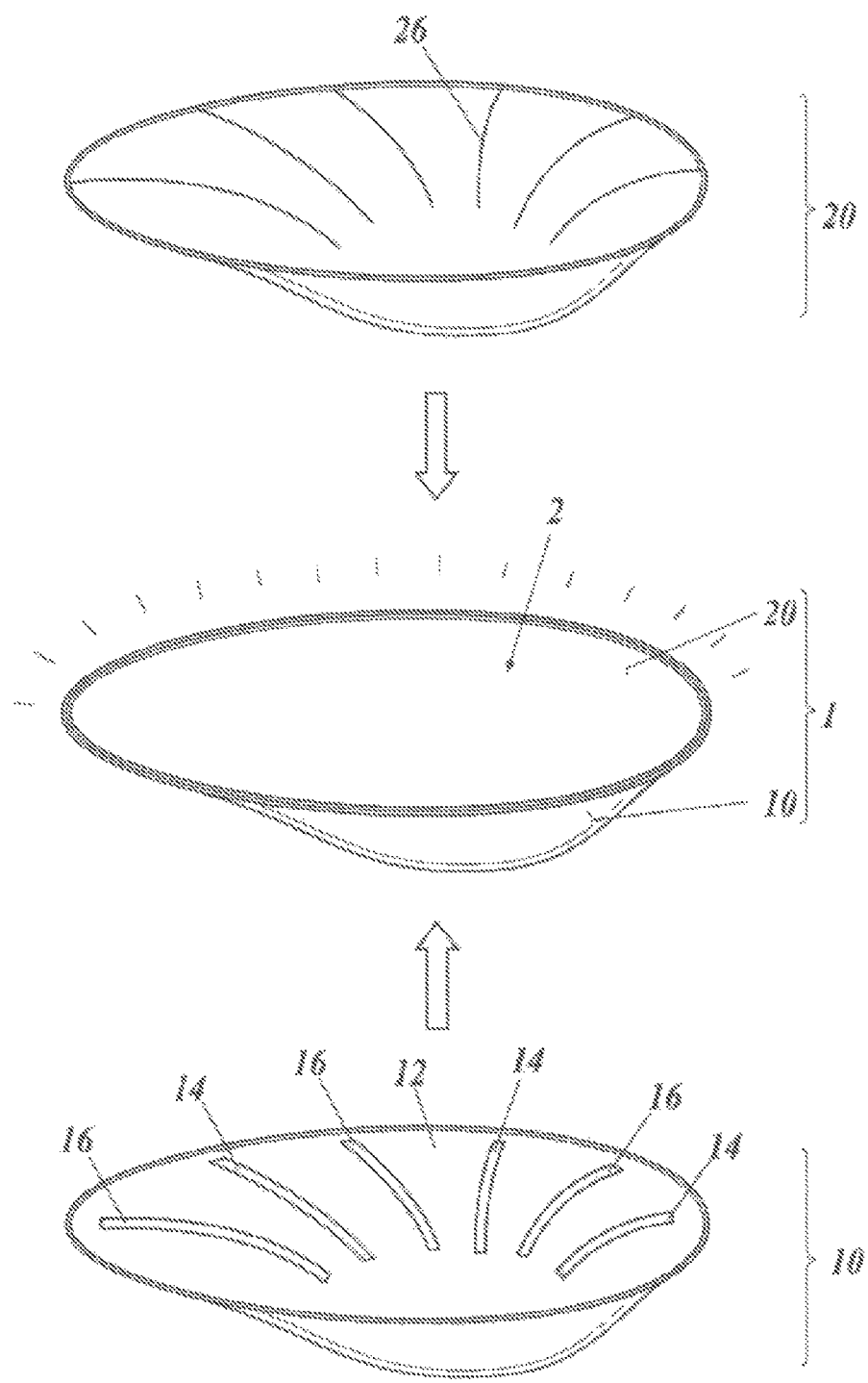
FIG. 1 is a schematic exploded perspective view of the structure of a luminescent device.

As shown in the center of FIG. 1, a luminescent device 1 is formed mainly with a frame 10 and an EL sheet 20, which are bonded to each other.

As shown in the bottom of FIG. 1, the frame 10 is formed with a sheet-like member that has a predetermined thickness and is curved into a concave shape, and maintains such a shape. The frame 10 is an example of the supporting member that supports the EL sheet 20.

On the inner surface 12 of the frame 10, electrode portions 14 (cathodes) and electrode portions 16 (anodes) are alternately arranged in a radial fashion. Wires (not shown) are connected to the respective electrode portions 14 and 16, so that conduction with an external circuit is achieved through the wires.

As shown in the top of FIG. 1, the EL sheet 20 has the same form (shape) as the frame 10.

Figure 2:
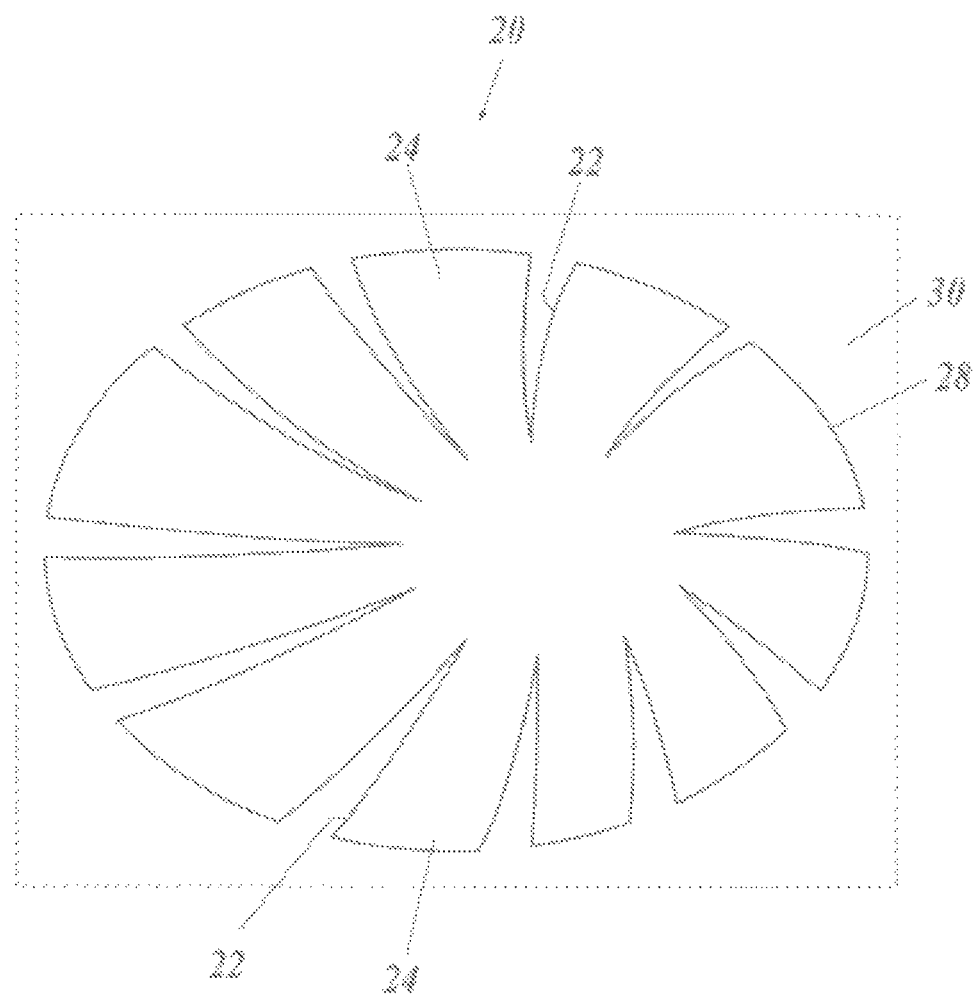
FIG. 2 is a schematic plan view of an EL sheet.

As shown in FIG. 2, the EL sheet 20 in a planar view has notches 22 extending from the elliptical rim portion toward the center portion, and has wing-like pieces 24 radially extending from the center portion. In the EL sheet 20, the respective notches 22 have respective predetermined widths, and joined portions 26 (see FIG. 1) are formed by narrowing the widths and joining the wing-like pieces 24 to one another. As a result, the EL sheet 20 is curved to have such a concave shape that can cover the inner surface 12 of the frame 10.

Figure 3:
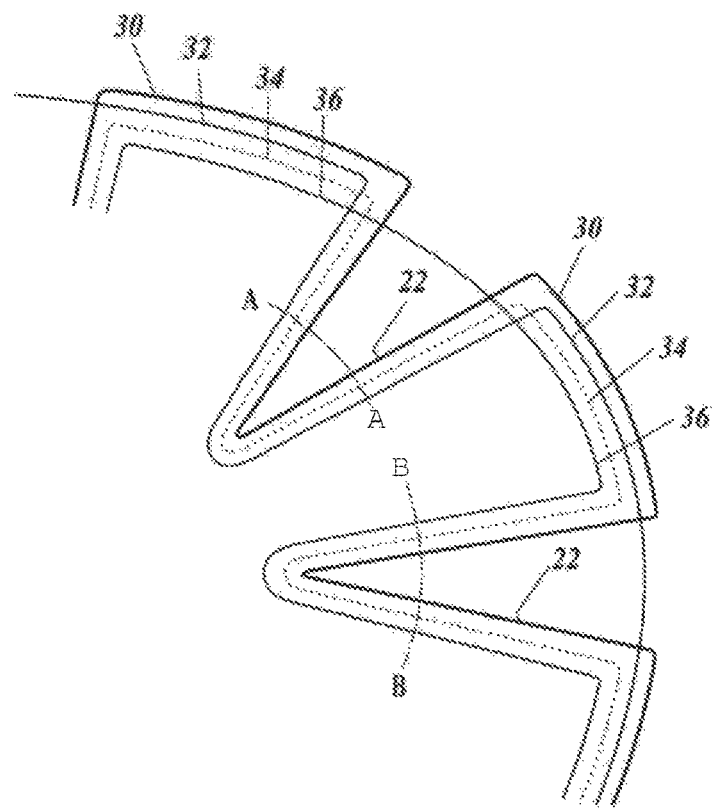
FIG. 3 is a schematic enlarged perspective plan view of part (an edge portion) of the EL sheet.

As shown in FIG. 3, the EL sheet 20 has a transparent substrate 30. The transparent substrate 30 is formed with a sheet made of resin.

An anode layer 32, an organic EL layer 34, and a cathode layer 36 are stacked in this order on the transparent substrate 30. Specifically, the anode layer 32 is formed directly on the transparent substrate 30. The organic EL layer 34 is formed on the anode layer 32 and covers almost the entire anode layer 32. The cathode layer 36 is further formed to cover almost the entire organic EL layer 34.

As shown in FIG. 2, the EL sheet 20 is cut along a cutoff line 28 and is then notched. As shown in FIG. 3, patterning is performed so that the organic EL layer 34 has such a predetermined shape as to avoid (or not to overlap) at least the notches 22, and the anode layer 32 and the cathode layer 36 have such predetermined shapes as to overlap the organic EL layer 34 while avoiding the respective notches 22 at certain sites.

The anode layer 32 is formed with a transparent electrode such as ITO, and the cathode layer 36 is formed with a metal such as Al.

The organic EL layer 36 is made of a known organic EL material, and is basically a light emitting layer containing a luminescent dopant and a host compound. The organic EL layer 36 may contain a known hole/electron transport layer, a known hole/electron injection layer, or the like.

Figure 4:
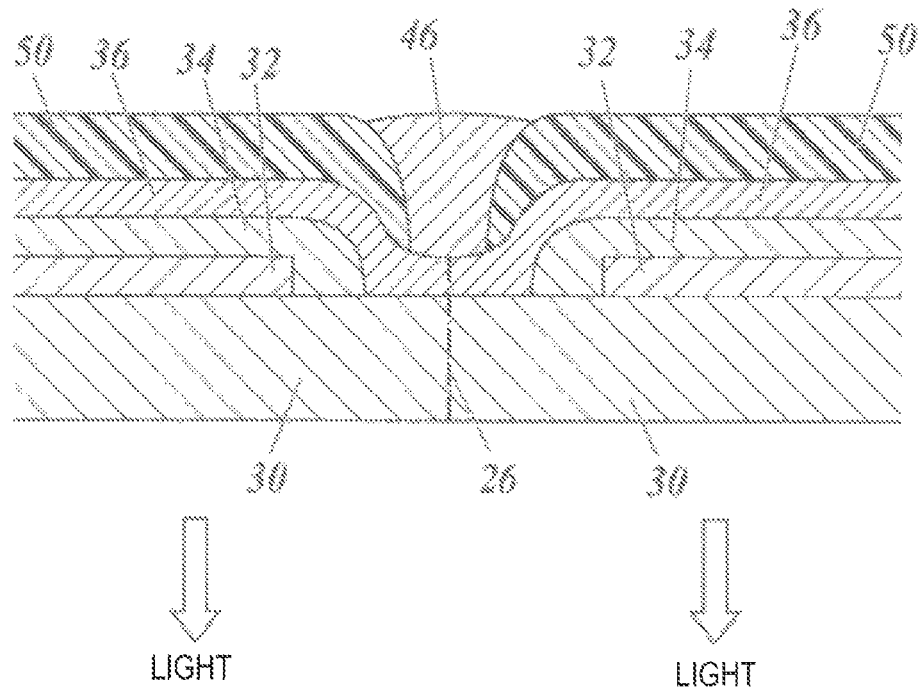
FIG. 4 is a cross-sectional view taken along the line A-A of FIG. 3.

FIG. 4 is a cross-sectional view taken along the line A-A of FIG. 3, and more specifically, is a diagram showing the rectangular transparent substrate 30 cut along the cutoff line 28 (see FIG. 2), with the wing-like pieces (24) of the transparent substrate 30 being joined to one another.

Figure 5:
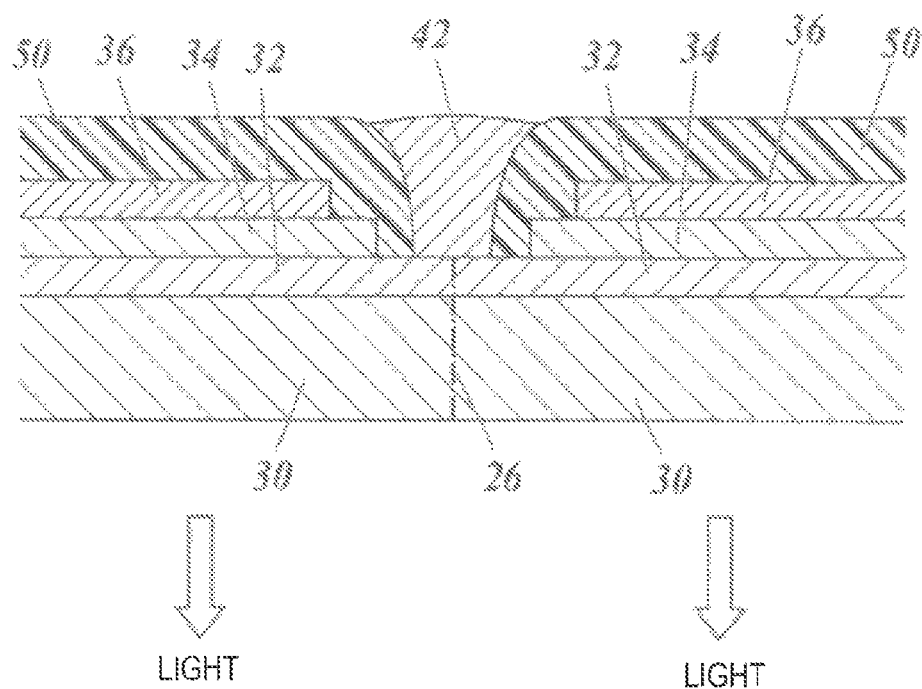
FIG. 5 is a cross-sectional view taken along the line B-B of FIG. 3.

FIG. 5 is a cross-sectional view taken along the line B-B of FIG. 3, and more specifically, is a diagram showing the rectangular transparent substrate 30 cut along the cutoff line 28 (see FIG. 2), with the wing-like pieces (24) of the transparent substrate 30 being joined to one another.

As shown in FIG. 4, edge portions of the cathode layer 36 are exposed through the cross-sectional portions along the line A-A of FIG. 3, and the side surfaces thereof are joined to one another at the joined portions 26.

The anode layer 32, the organic EL layer 34, and the cathode layer 36 are sealed with resin portions 50. With this structure, corrosion of the anode layer 32 and the cathode layer 36 is prevented, and degradation of the organic EL layer 34 due to the air or moisture is prevented. Gaps are formed between the resin portions 50. The joined portions of the cathode layer 36 are exposed through the gaps between the resin portion 50, and feeding portions 46 (cathodes) are formed on the exposed portions.

Meanwhile, as shown in FIG. 5, edge portions of the anode layer 32 are exposed through the cross-sectional portions along the line B-B of FIG. 3, and the side surfaces thereof are joined to one another at the joined portions 26.

The anode layer 32, the organic EL layer 34, and the cathode layer 36 are sealed with resin portions 50, and gaps are formed between the resin portions 50, as described above. The joined portions of the anode layer 32 are exposed through the gaps between the resin portions 50, and feeding portions 42 (anodes) are formed on the exposed portions.

Next, a method of manufacturing the luminescent device 1 is described.

The method of manufacturing the luminescent device 1 basically includes the following steps (1) through (3).

(1) The step of forming the anode layer 32, the cathode layer 36, and the organic EL layer 34 on the transparent substrate 30.

(2) The step of cutting the transparent substrate 30 along the cutoff line 28.

(3) The step of bonding the EL sheet 20 and the frame 10 to each other.

In step (1), the anode layer 32, the organic EL layer 34, and the cathode layer 36 are formed on the transparent substrate 30 through patterning, with the cutoff line 28 being taken into consideration.

In step (2), the transparent substrate 30 is cut along the cutoff line 28, to form the notches 22 and the wing-like pieces 24. The notching direction, the number of notches, and the notch size can be changed as appropriate, and can be set with the curved posture of the EL sheet 20 being taken into consideration.

It should be noted that either step (1) or step (2) may be carried out first, and the order of these steps is not fixed.

Step (3) is carried out after steps (1) and (2).

In step (3), the wing-like pieces 24 are joined to one another while the EL sheet 20 is being three-dimensionally curved, and the feeding portions 42 and 46 are formed at the joined portions 26. Also, the stack structure of the anode layer 32, the organic EL layer 34, and the cathode layer 36 is sealed with the resin portions 50.

After that, the anode layer 32 and the cathode layer 36 of the EL sheet 20 are made to face the electrode portions 16 and the electrode portions 14 of the frame 10 via the feeding portions 42 and 46, and the EL sheet 20 and the frame 10 are bonded to each other in an overlapping manner.

At this point, the electrode portions 14 of the frame 10 are made to face and are connected to the feeding portions 46 of the organic EL sheet 20, and the electrode portions 16 of the frame 10 are made to face and are connected to the feeding portions 42 of the organic EL sheet 20. When power is supplied through wires (not shown) in this situation, the organic EL layer 34 emits light, and the light is released from the side of the transparent substrate 30 (see FIGS. 4 and 5). As a result, the inner surface 2 of the luminescent device 1 planarly emits light (see FIG. 1).

In the above luminescent device 1, the notches 22 are formed at the rim portion of the EL sheet 20. Accordingly, the EL sheet 20 can be three-dimensionally curved by joining adjacent wing-like pieces 24 to each other. Meanwhile, in the EL sheet 20, part of the anode layer 32 and part of the cathode layer 36 are exposed through the respective joined portions 26. Accordingly, power can be supplied to the respective exposed portions from the electrode portions 16 and 14 via the feeding portions 42 and 46. Thus, even in a three-dimensionally curved state, the luminescent device 1 having a simple structure can be made to planarly emit light.

[Examples of Applications]

The luminescent device 1 can be installed as a light emitting device at any site that has a shape corresponding to the above described form (shape).

Figure 6:
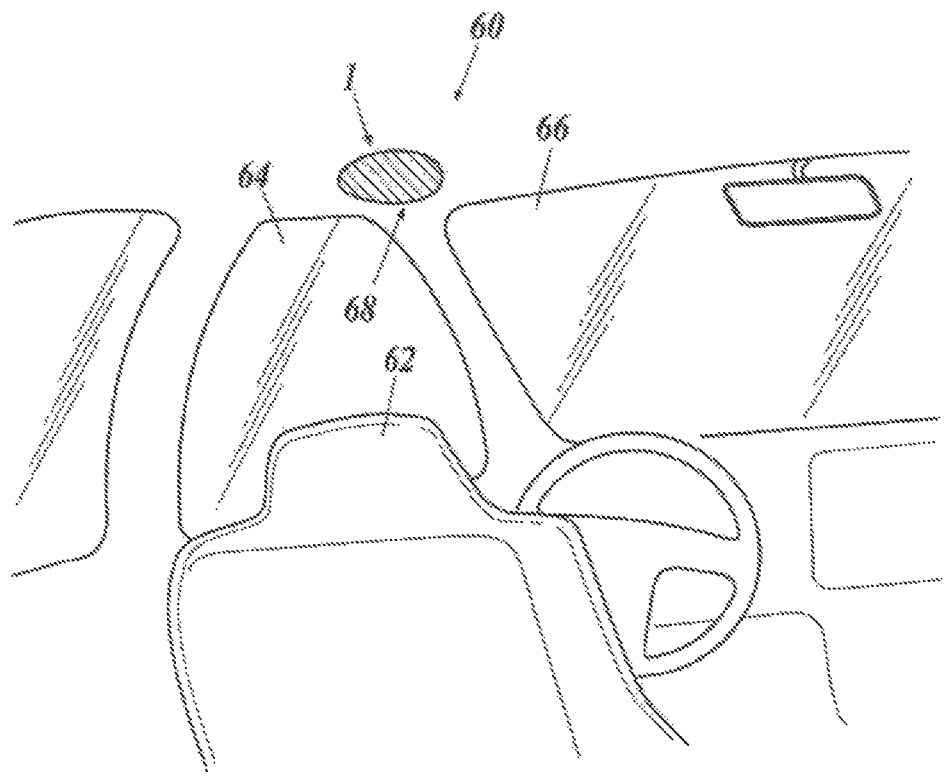
FIG. 6 is a schematic perspective view of an example application of the luminescent device to a vehicle.

For example, as shown in FIG. 6, the luminescent device 1 can be installed at a corner portion 68 between car windows 64 and 66 near a front seat 62 of a vehicle 60.

Figure 7:
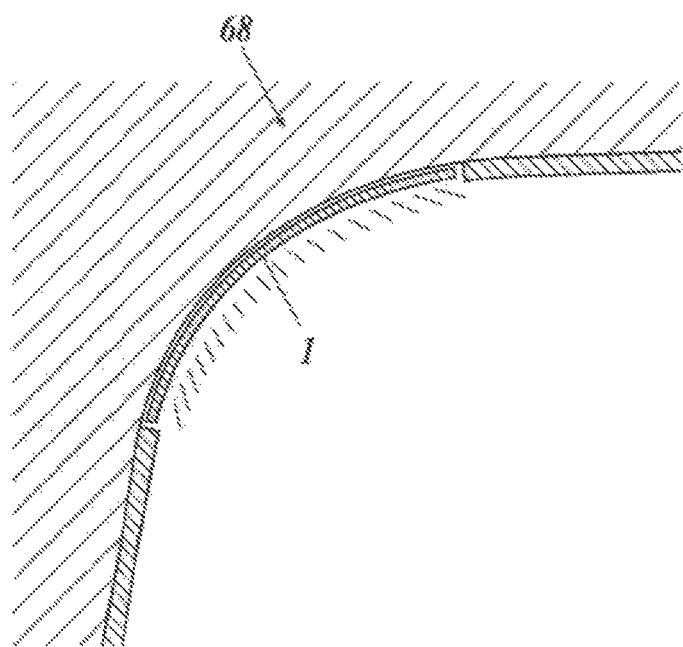
FIG. 7 is a cross-sectional view of the luminescent device of FIG. 6 installed in a vehicle.
Figure 8:
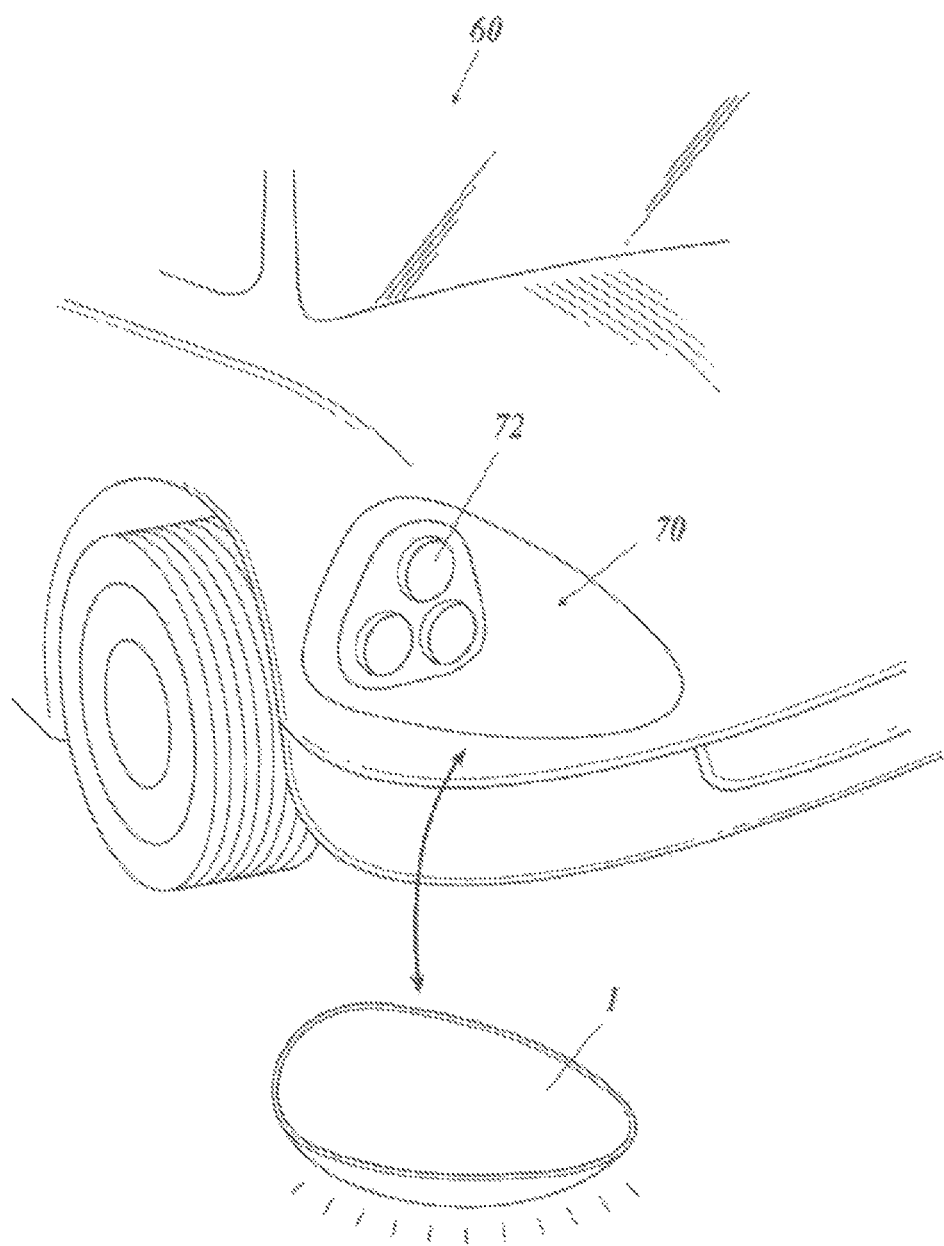
FIG. 8 is a schematic perspective view of another example application of the luminescent device to a vehicle.

In this configuration, the luminescent device 1 serving as a room lamp in the vehicle 60 does not protrude toward the inside of the vehicle 60, as shown in FIG. 7. Accordingly, the atmosphere in the internal space of the vehicle 60 can be prevented from being spoiled, and the inside of the car can be presented as a comfortable space.

It is also possible to install the luminescent device 1 at a headlight portion 70 of the vehicle 60.

Where the cathode layer 36 is made of a transparent material in this structure, planar light emission toward the outside of the luminescent device 1 becomes possible, and accordingly, the luminescent device 1 can be made to function as a width indicator, independently of a projector lamp 72.

[Second Embodiment]

Figure 9:
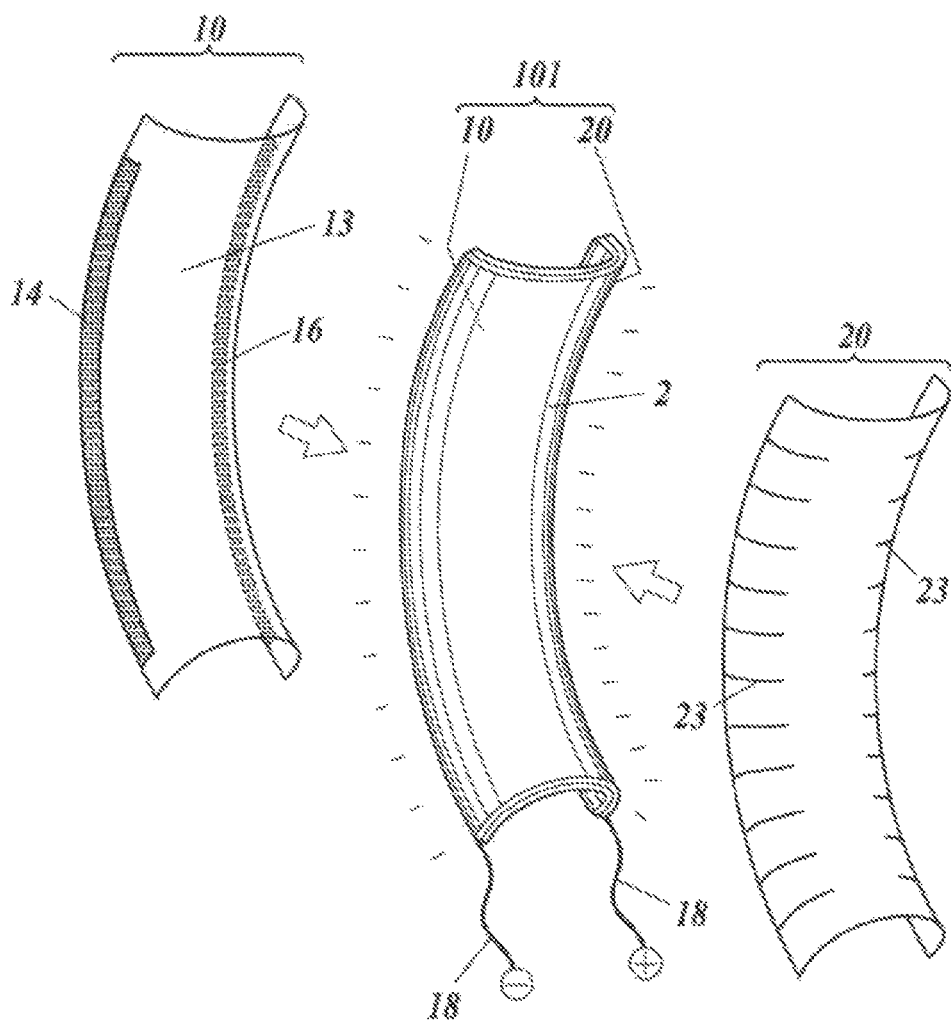
FIG. 9 is a schematic exploded perspective view of the structure of a luminescent device.

As shown in the center of FIG. 9, a luminescent device 101 is formed mainly with a frame 10 and an EL sheet 20, which are bonded to each other.

As shown in the left side of FIG. 9, the frame 10 has a shape that appears as if a sheet-like member having a predetermined thickness were curved into a semi-cylindrical shape and were warped (or were curved double), and maintains such a shape. The frame 10 is an example of the supporting member that supports the EL sheet 20.

An electrode portion 14 (cathode) is formed in the form of a line at one of the rim portions of the surface 13 of the frame 10, and an electrode portion 16 (anode) is formed in the form of a line at the other one of the rim portions. Wires 18 are connected to the respective electrode portions 14 and 16, so that conduction with an external circuit is achieved through the wires 18.

As shown in the right side of FIG. 9, the EL sheet 20 has the same form (shape) as the frame 10.

Figure 10:
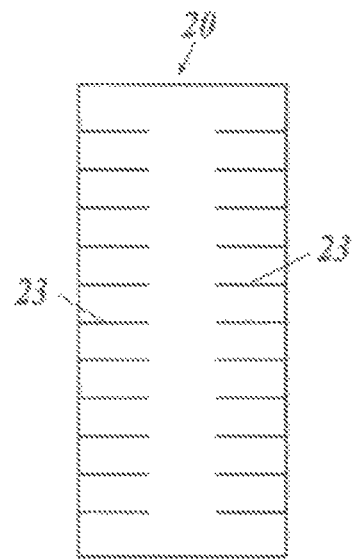
FIG. 10 is a schematic plan view of an EL sheet.

As shown in FIG. 10, the EL sheet 20 in a planar view has a rectangular shape, and slits 23 are formed at both rim portions. As the respective slits 23 are split open, the EL sheet 20 is curved and warped so as to cover the surface 13 of the frame 10.

Figure 11:
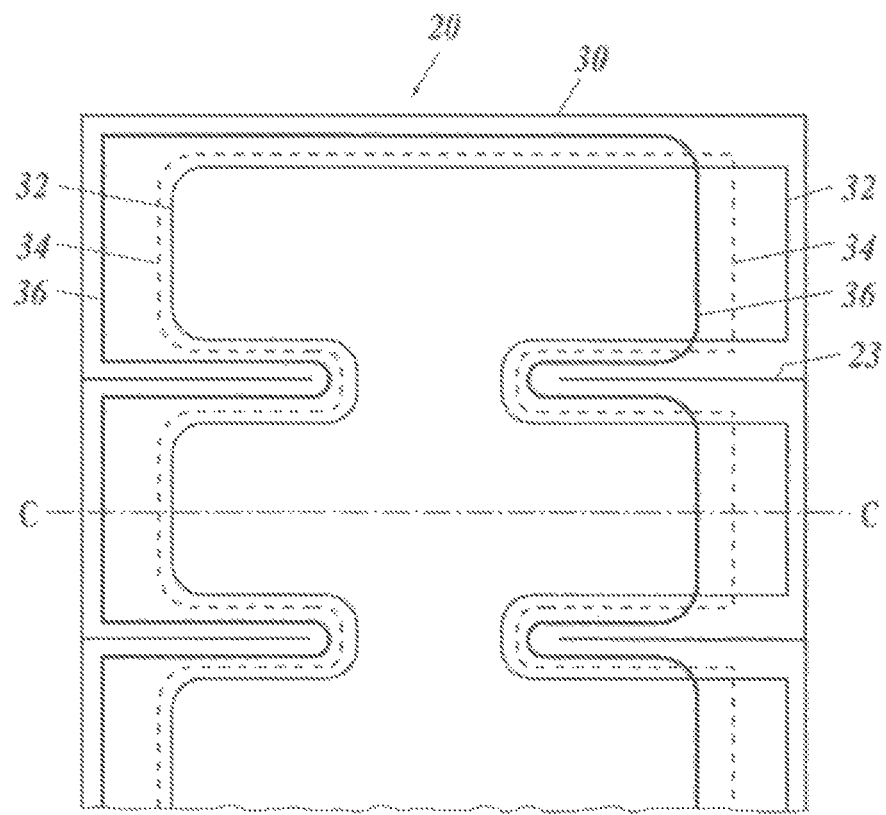
FIG. 11 is a schematic enlarged perspective plan view of part (an edge portion) of the EL sheet.

As shown in FIG. 11, the EL sheet 20 has a rectangular transparent substrate 30. The transparent substrate 30 is formed with a sheet made of resin.

Figure 12:
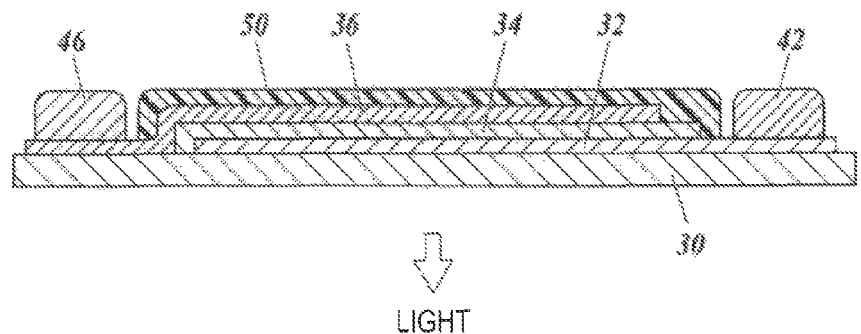
FIG. 12 is a cross-sectional view taken along the line C-C of FIG. 11.

An anode layer 32, an organic EL layer 34, and a cathode layer 36 are stacked in this order on the transparent substrate 30. Specifically, the anode layer 32 is formed directly on the transparent substrate 30, as shown in FIG. 12. The organic EL layer 34 is formed on the anode layer 32 and covers almost the entire anode layer 32. The cathode layer 36 is further formed to cover almost the entire organic EL layer 34.

The anode layer 32 is formed with a transparent electrode such as ITO, and the cathode layer 36 is formed with a metal such as Al.

The organic EL layer 36 is made of a known organic EL material, and is basically a light emitting layer containing a luminescent dopant and a host compound. The organic EL layer 36 may contain a known hole/electron transport layer, a known hole/electron injection layer, or the like.

As shown in FIG. 11, the slits 23 of the EL sheet 20 are formed only in the transparent substrate 30, and the anode layer 32, the organic EL layer 34, and the cathode layer 36 are formed into predetermined shapes through patterning so as to avoid (not to overlap) the slits 23.

As shown in FIG. 12, edge portions of the anode layer 32 are exposed through the organic EL layer 34, and feeding portions 42 (anodes) are formed on the exposed portions. Meanwhile, edge portions of the cathode layer 36 is also exposed on the organic EL layer 34 and the transparent substrate 30, and feeding portions 46 (cathodes) are formed on the exposed portions. The feeding portions 42 and 46 are made of a conductive material. At the exposed portions of the anode layer 32 and the exposed portions of the cathode layer 36, the anode layer 32, the organic EL layer 34, and the cathode layer 36 are sealed with resin portions 50. With this structure, corrosion of the anode layer 32 and the cathode layer 36 is prevented, and degradation of the organic EL layer 34 due to the air or moisture is prevented.

Next, a method of manufacturing the luminescent device 101 is described.

The method of manufacturing the luminescent device 101 basically includes the following steps (1) through (3).

(1) The step of forming the slits 23 at the rim portions of the transparent substrate 30.

(2) The step of forming the anode layer 32, the cathode layer 36, and the organic EL layer 34 on the transparent substrate 30.

(3) The step of bonding the EL sheet 20 and the frame 10 to each other.

In step (1), the transparent substrate 30 is cut at the rim portions, to form the slits 23. The slitting direction, the number of slits, and the slit length can be changed as appropriate, and can be set with the curved posture of the EL sheet 20 being taken into consideration.

In step (2), the anode layer 32, the organic EL layer 34, and the cathode layer 36 are formed on the transparent substrate 30 through patterning so as to avoid the slits 23. In this case, part of the anode layer 32 and part of the cathode layer 36 are exposed through the respective slits 23 of the transparent substrate 30.

After that, the feeding portions 42 and 46 are formed on the respective exposed portions of the anode layer 32 and the cathode layer 36, and the anode layer 32, the organic EL layer 34, and the cathode layer 36 are sealed with the resin portions 50.

It should be noted that either step (1) or step (2) may be carried out first, and the order of these steps is not fixed.

Step (3) is carried out after steps (1) and (2).

In step (3), the anode layer 32 and the cathode layer 36 of the EL sheet 20 are made to face the electrode portion 16 and the electrode portion 14 of the frame 10 via the feeding portions 42 and 46. The respective slits 23 of the EL sheet 20 are then split open, so that the EL sheet 20 is three-dimensionally curved, and the EL sheet 20 and the frame 10 are bonded to each other in an overlapping manner.

At this point, the electrode portion 14 of the frame 10 is made to face and is connected to the feeding portions 46 of the organic EL sheet 20, and the electrode portion 16 of the frame 10 is made to face and is connected to the feeding portions 42 of the organic EL sheet 20. When power is supplied through the wires 18 in this situation, the organic EL layer 34 emits light, and the light is released from the side of the transparent substrate 30 (see FIG. 12). As a result, the inner surface 2 of the luminescent device 101 planarly emits light (see FIG. 9).

In the above luminescent device 101, the slits 23 are formed at the rim portions of the EL sheet 20. Accordingly, the EL sheet 20 can be three-dimensionally curved when the respective slits 23 are split open to form gaps. Meanwhile, in the EL sheet 20, part of the anode layer 32 and part of the cathode layer 36 are exposed through the slits 23. Accordingly, power can be supplied to the respective exposed portions from the electrode portions 16 and 14 via the feeding portions 42 and 46. Thus, even in a three-dimensionally curved state, the luminescent device 101 having a simple structure can be made to planarly emit light.

[Example of Application]

The luminescent device 101 can be installed as a light emitting device at any site that has a shape corresponding to the above described form (shape).

Figure 13:
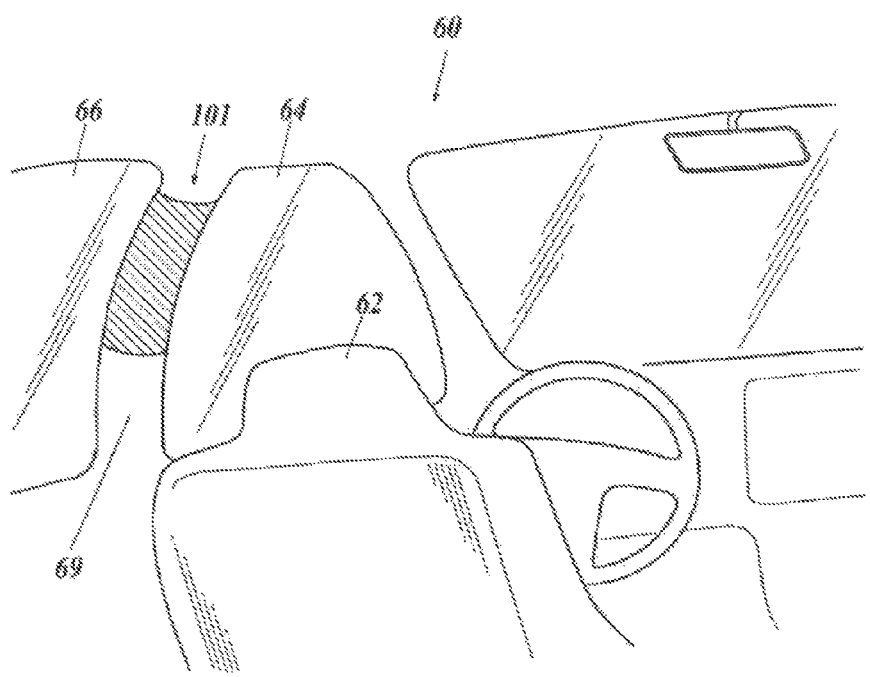
FIG. 13 is a schematic perspective view of an example application of the luminescent device to a vehicle.

For example, as shown in FIG. 13, the luminescent device 101 can be installed at a frame portion 69 between the respective car windows 64 and 66 of a front seat 62 and a back seat (not shown) of a vehicle 60.

In this configuration, the luminescent device 101 serving as a room lamp in the vehicle 60 does not protrude toward the inside of the vehicle 60. Accordingly, the atmosphere in the internal space of the vehicle 60 can be prevented from being spoiled, and the inside of the car can be presented as a comfortable space.

INDUSTRIAL APPLICABILITY

The present invention relates to luminescent devices and methods of the luminescent devices, and is particularly suitable in causing a luminescent device to planarly emit light even in a three-dimensionally curved state.

REFERENCE SIGNS LIST

1 Luminescent device
10 Frame
12 Inner surface
13 Surface
14 Electrode portion (cathode)
16 Electrode portion (anode)
20 EL sheet
22 Notch
23 Slit
24 Wing-like piece
26 Joined portion
28 Cutoff line
30 Transparent substrate
32 Anode layer
34 Organic EL layer
36 Cathode layer
42 Feeding portion (anode)
46 Feeding portion (cathode)
50 Resin portion
60 Vehicle
62 Seat
64, 66 Car window
68 Corner portion
69 Frame portion
70 Headlight portion
72 Projector lamp
101 Luminescent device

The invention claimed is:

1. A luminescent device comprising an electroluminescence (EL) sheet having at least an anode layer, a cathode layer, and an organic EL layer formed on a substrate, the organic EL layer being placed between the anode layer and the cathode layer,
   wherein
   a plurality of notches or slits are formed at a rim of the substrate to enable a planar light emittance in a curved state, each of the notches or slits extending from an outer perimeter of the substrate towards a center of the substrate in a plan view,
   patterning is performed on the substrate so that the organic EL layer avoids the notches or the slits, and
   part of the anode layer and part of the cathode layer are exposed through the respective notches or exposed between the slits of the substrate.

2. The luminescent device according to claim 1, further comprising
   a supporting member configured to support the EL sheet,
   wherein the supporting member has a three-dimensionally curved shape.

3. The luminescent device according to claim 2, wherein the supporting member has electrode portions formed therein, the electrode portions corresponding to exposed portions of the anode layer of the EL sheet and exposed portions of the cathode layer of the EL sheet.

4. The luminescent device according to claim 1, wherein the luminescent device has a three-dimensionally curved surface and emits light from the curved surface.

5. The luminescent device according to claim 1, wherein the notches are wedge-shaped and the slits are linear.

6. A luminescent device comprising an electroluminescence (EL) sheet having at least an anode layer, a cathode layer, and an organic EL layer formed on a substrate, the organic EL layer being placed between the anode layer and the cathode layer,
wherein
a plurality of notches are formed at a rim of the substrate to enable a planar light emittance in a curved state, each of the notches extending from an outer perimeter of the substrate towards a center of the substrate in a plan view,
patterning is performed on the substrate so that the organic EL layer avoids the notches, and the anode layer and the cathode layer overlap the organic EL layer, and
part of the anode layer and part of the cathode layer are exposed through the respective notches of the substrate.

7. The luminescent device according to claim 6, further comprising
a supporting member configured to support the EL sheet, wherein the supporting member has a three-dimensionally curved shape.

8. The luminescent device according to claim 6, wherein the luminescent device has a three-dimensionally curved surface and emits light from the curved surface.

9. The luminescent device according to claim 6, wherein the notches are wedge-shaped.

10. A luminescent device comprising an electroluminescence (EL) sheet having at least an anode layer, a cathode layer, and an organic EL layer formed on a substrate, the organic EL layer being placed between the anode layer and the cathode layer,
wherein
a plurality of slits are formed at a rim of the substrate to enable a planar light emittance in a curved state, each of the slits extending from an outer perimeter of the substrate towards a center of the substrate in a plan view,
patterning is performed on the substrate so that the anode layer, the cathode layer, and the organic EL layer avoid the slits, and
part of the anode layer and part of the cathode layer are exposed between the slits of the substrate.

11. The luminescent device according to claim 10, further comprising
a supporting member configured to support the EL sheet, wherein the supporting member has a three-dimensionally curved shape.

12. The luminescent device according to claim 10, wherein the luminescent device has a three-dimensionally curved surface and emits light from the curved surface.

13. The luminescent device according to claim 10, wherein the slits are linear.

* * * * *